United States Patent [19]
Westerman

[11] Patent Number: 6,084,481
[45] Date of Patent: Jul. 4, 2000

[54] PHASE LOCKING METHOD AND APPARATUS USING SWITCHED DRIVE SIGNAL

[75] Inventor: Stephen J Westerman, Santa Rosa, Calif.

[73] Assignee: Hewlett-Packard Company, Palo Alto, Calif.

[21] Appl. No.: 09/299,705

[22] Filed: Apr. 26, 1999

[51] Int. Cl.$^7$ ...................................................... H03L 7/10
[52] U.S. Cl. ............................... 331/25; 331/14; 331/17; 331/18; 327/156
[58] Field of Search .................................. 331/11, 14, 17, 331/18, 25, 56, DIG. 2; 327/156–159

[56] References Cited

U.S. PATENT DOCUMENTS 3,158,820  11/1964  Lamplot ...................................... 331/17

*Primary Examiner*—David Mis
*Attorney, Agent, or Firm*—John L. Imperato

[57] ABSTRACT

A phase locking method and apparatus use an applied drive signal to acquire and maintain phase lock, and to prevent false locking in the presence of spurious signals. Locking signal and spurious signal components of a feedback signal within the feedback path of a phase locked loop are filtered and summed with the drive signal having a frequency offset from the loop's reference signal and an amplitude less than that of the locking signal and greater than that of the spurious signals. The summed signals are limited so that the overall phase of the limited signal is determined by the signal of highest amplitude. When the drive signal amplitude exceeds the amplitude of the filtered locking signal, the phase of the limited signal is determined by the drive signal. When the amplitude of the filtered locking signal exceeds the drive signal amplitude, the phase of the limited signal is determined by the locking signal. The limited signal is phase compared to the reference signal of the phase locked loop to generate an error signal for steering the frequency of the locking signal.

15 Claims, 2 Drawing Sheets

6,084,481

PHASE LOCKING METHOD AND APPARATUS USING SWITCHED DRIVE SIGNAL

BACKGROUND OF THE INVENTION

Spurious signals can degrade the performance of phase locked loops and the performance of the systems in which the phase locked loops are used. If not accounted for, spurious signals impair the ability of a phase locked loop to acquire and maintain a phase-locked condition. The chance of false locking, that is, phase locking to an undesired spurious signal rather than a desired locking signal provided by a voltage controlled oscillator (VCO), also increases as the amplitudes of spurious signals increase relative to the amplitude of locking signal.

SUMMARY OF THE INVENTION

A phase locking method and apparatus constructed according to the preferred embodiments of the present invention use an applied drive signal to acquire and maintain phase lock, and to prevent false locking in the presence of spurious signals. Locking signal and spurious signal components of a feedback signal within the feedback path of a phase locked loop are filtered and summed with a drive signal having a frequency offset from the loop's reference signal and an amplitude less than that of the locking signal and greater than that of the spurious signals. The summed signals are limited so that the overall phase of the limited signal is determined by the signal of highest amplitude. When the drive signal amplitude exceeds the amplitude of the filtered locking signal, the phase of the limited signal is determined by the drive signal. When the amplitude of the filtered locking signal exceeds the drive signal amplitude, the phase of the limited signal is determined by the locking signal. The limited signal is phase compared to the reference signal of the phase locked loop to generate an error signal for steering the frequency of the locking signal.

DETAILED DESCRIPTION OF THE PREFERRED EMBODIMENT

Figure 1:
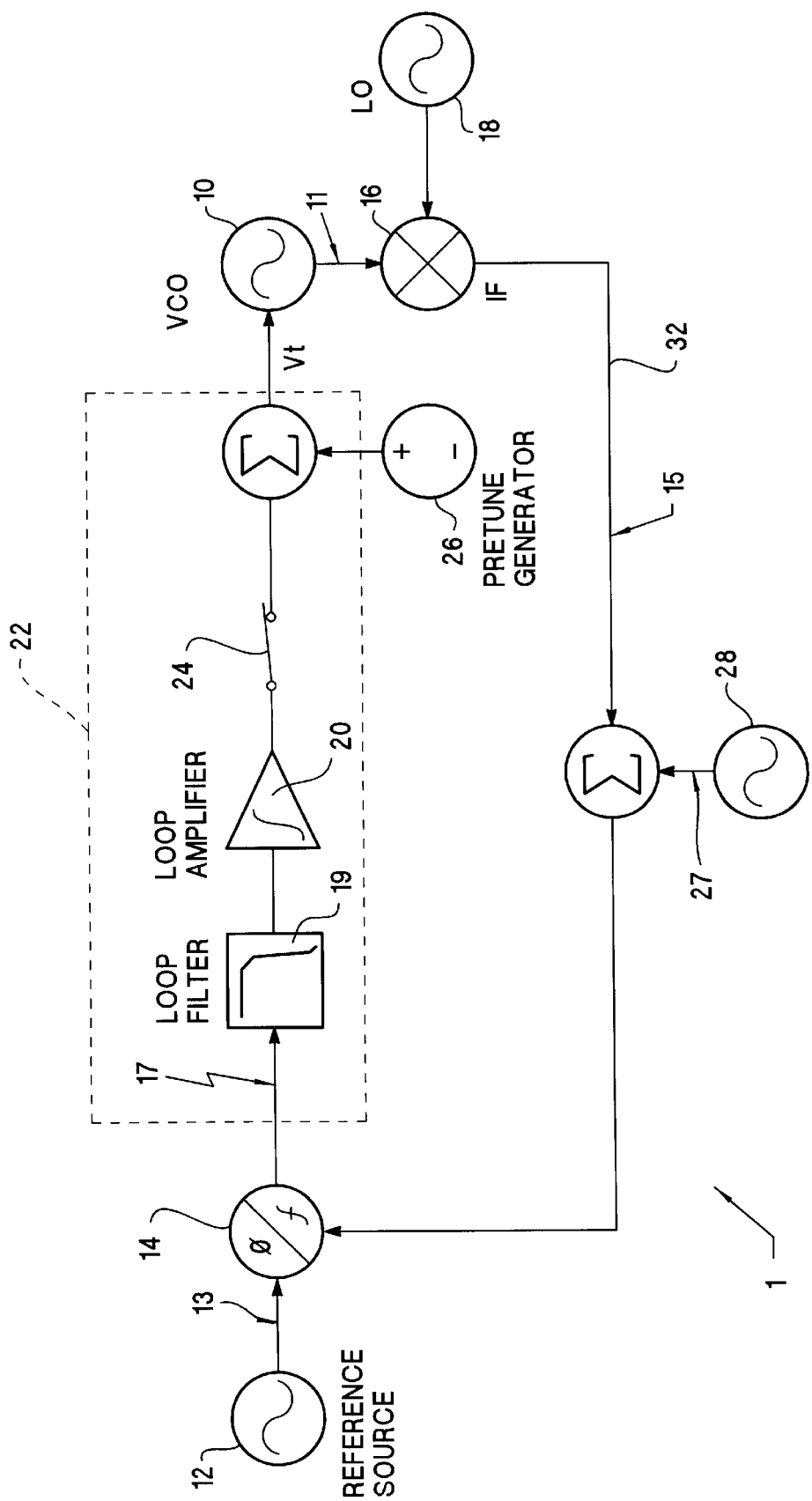
FIG. 1 shows a prior art phase locked loop.

FIG. 1 shows a prior art phase locked loop 1 in which a voltage-controlled oscillator (VCO) 10 is phase locked to a reference signal 13 provided by a reference source 12. A phase comparator 14 continuously monitors the phase difference between the reference signal 13 and a feedback signal 15. The feedback signal 15 is provided by the VCO 10 directly, or alternatively is derived from the VCO 10 as an intermediate frequency (IF) signal from a mixer 16 driven by a local oscillator (LO) 18 as shown. Based on the phase comparison, the phase comparator 14 generates an error signal 17 that is processed by loop filter 19 and loop amplifier 20 in the forward path 22 of the phase locked loop 1, and controls the frequency and phase of the signal 11 produced by the VCO 10. The loop 1 is maintained in the phase locked state when the error signal 17 is within a prescribed range.

A loop switch 24 and pre-tune generator 26 are included in the phase locked loop 1 to enable acquisition of the phase locked state. Typically, the phase lock acquisition sequence includes the following steps: opening the loop switch 24; pre-tuning the VCO 10 with pretune generator 26 so that the frequency of the feedback signal 15 produced by, or derived from, the VCO 10 is within the capture range of the loop 1; closing the loop switch 24; and waiting for the loop 1 to settle into the phase locked state.

Spurious signals, including mixing spurs, signal feedthrough from the local oscillator 18 and VCO 10, noise, and interference signals, are modeled by a spurious signal 27 summed into the feedback path 32 of the phase locked loop 1 from a spurious signal source 28. Acquisition and maintenance of the phase locked state becomes progressively more difficult as the amplitudes of the spurious signals 27 increase relative to the amplitude of the feedback signal 15. False locking of the phase locked loop 1 occurs when the loop 1 cannot distinguish between the desired feedback signal 15 and a spurious signal 27 that has an amplitude and frequency also satisfying the condition for the phase locked state. In a false locked state, the error signal 17 is within the prescribed range, indicating that the phase locked loop 1 is in the phase locked state, however, the phase comparator 14 is responsive to the spurious signal 27 rather than the desired feedback signal 15, causing the VCO 10 to provide an output signal 11 that does not correspond to the desired feedback signal 15.

Figure 2:
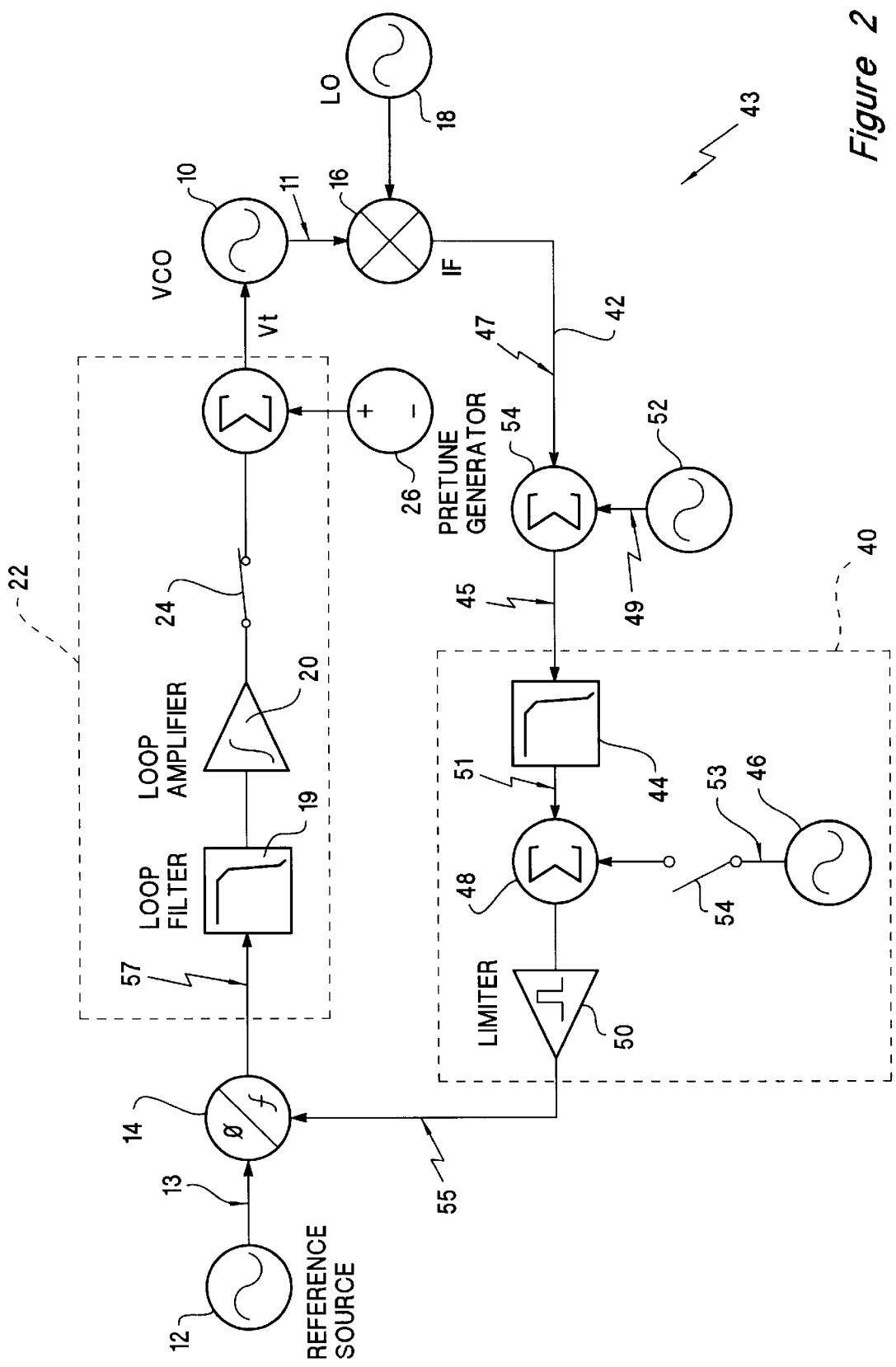
FIG. 2 shows a phase locking apparatus constructed according to the preferred embodiment of the present invention.

FIG. 2 shows a phase locking apparatus 40 constructed according to the preferred embodiment of the present invention. The phase locking apparatus 40, is shown included within the feedback path 42 of a phase locked loop 43, includes a filter 44, drive signal source 46, summer 48 and limiter 50. The phase locking apparatus 40 ensures acquisition and maintenance of a phase locked state within a phase locked loop 43 and reduces the likelihood of false locking.

The phase locked loop 43, into which the phase locking apparatus 40 is included, has a feedback signal 45 within a feedback path 42. This feedback signal 45 has a locking signal component 47, which is provided directly by a voltage controlled oscillator (VCO) 10, or alternatively, is derived from the VCO 10 using the mixer 16 and local oscillator 18 as shown, which produce an intermediate frequency (IF) signal. The feedback signal 45 within the feedback path 42 of the phase locked loop 43 also has spurious signal components 49, including mixing spurs, signal feedthrough from the local oscillator 18 and VCO 10, noise, and interference signals. These spurious signal components 49 are modeled by a spurious signal source 52 and summing node 54 in the feedback path 42.

The locking signal component 47 and spurious signal components 49 of the feedback signal 45 are applied to the filter 44 within the phase locking apparatus 40. The filter 44, which in this example is a lowpass filter, reduces noise and other signals within the spurious signal components 49 that do not fall within the passband of the filter 44. As alternatives to a lowpass filter, other types of filters 44 are chosen, based on the attributes of the spurious signal components 49 and the attributes of phase locked loop into which the phase locking apparatus 40 is included. The lowpass filter 44 in this example has a cut-off frequency that is approximately an order of magnitude above that of the loop filter 19 to reduce accumulated phase shift through the phase locked loop 43 and ensure stable operation of the loop 43.

The feedback signal 45 is bandlimited by the filter 44 to produce a filtered feedback signal 51 at the output of the filter 44. The filter 44 rejects the locking signal component 47 when it falls outside the filter bandwidth and rejects spurious signal components 49 when they are outside the filter bandwidth. The filtered feedback signal 51 is applied to the summer 48 within the phase locking apparatus 40 where it is combined with a drive signal 53, supplied by the drive signal source 46. The drive signal 53 has a frequency offset from the loop's reference signal 13 and an amplitude less than that of the locking signal component 47 and greater than that of the spurious signal components 49.

Once the filtered feedback signal 51 and drive signal 53 are combined by the summer 48, the summed signals are applied to the limiter 50 producing a limited signal 55. The overall phase of the limited signal 55 is determined by the one of the summed signals having the highest amplitude. For example, when the amplitude of the drive signal 53 exceeds the amplitude of the filtered locking signal component within the filtered feedback signal 51, the phase of the limited signal 55 is determined by the drive signal 53. When the amplitude of the filtered locking signal component of the filtered feedback signal 51 exceeds the amplitude of the drive signal 53, the phase of the limited signal 55 is determined by the locking signal component of the filtered feedback signal 51.

The limited signal 55 is then applied to the phase comparator 14 which also receives the reference signal 13 of the phase locked loop 43. The phase comparator 14 generates an error signal 57 based on the phase comparison that is processed by a loop filter 19 and a loop amplifier 20 in the forward path of the phase locked loop 43. The error signal 57 steers the frequency and phase of the signal 11 produced by the VCO 10. The loop 43 is maintained in the phase locked state when the error signal 57 is within a prescribed range.

The phase comparator 14 is responsive to the difference between the phase of the reference signal 13 and the phase of the limited signal 55. The phase of the limited signal 55, in turn, is determined by the drive signal 53 when its amplitude exceeds the amplitude of the filtered locking signal component of the filtered feedback signal 51 and is determined by the locking signal component when its amplitude exceeds the amplitude of the drive signal 53. The limiter 50 causes the phase comparator 14 to be unresponsive to the spurious signal components 49, reducing the impact of the spurious signal components 49 on the performance of the phase locked loop 43. Acquisition of the phase locked state is determined by the drive signal 53 when its amplitude exceeds that of the filtered locking signal component within the filtered feedback signal 51. Maintenance of the phase locked state is determined by the locking signal component when its amplitude exceeds that of the drive signal 53.

Acquisition of the phase locked state is facilitated by the phase locking apparatus 40. First the loop switch 24 is opened breaking the forward path 22 of the phase locked loop 43. The VCO 10 is then pre-tuned using pretune generator 26 so that the frequency of the locking signal component 47 produced by, or derived from, the VCO 10 is within a designated frequency range. The drive signal 53 is then summed with the filtered feedback signal 51 by closing a switch 54 and limited, causing the phase comparator 14 to respond to one of the filtered locking signal component and the drive signal 53, depending on which has the greater amplitude. When the loop switch 24 is closed, the error signal 57, as processed by the loop filter 19 and loop amplifier 20 and applied to the VCO 10, drives the frequency of the locking signal component 47 to within a frequency range that the phase locked loop 43 can respond to acquire the phase locked state. Under the condition that the amplitude of the drive signal 53 exceeds that of the filtered locking signal component of the filtered feedback signal 51, steering of the frequency of the VCO 10 is determined by the drive signal 53, not the spurious signal components 49. This positions the locking signal component 47 of the feedback signal 45 at a designated frequency offset from the frequency of the reference signal 13, within the frequency capture range of the loop 43. Positioning of the locking signal component 47 ensures acquisition of the phase locked state. Once the locking signal component 47 of the feedback signal 45 is within the frequency capture range of the loop 43, the loop 43 ultimately settles in the phase locked state. In the phase locked state, the amplitude of the filtered locking signal component of the filtered feedback signal 51 exceeds that of the drive signal 53, causing the phase comparator 14 to then be responsive to the locking signal component. Once the phase locked state is acquired and maintained by the amplitude domination of the drive signal 53 by the locking signal component 47, the drive signal 53 is optionally removed by opening the drive switch 54.

The functional elements of the phase locking apparatus 40 shown in FIG. 2 are implemented using analog hardware, digital hardware or software. Alternatively, a phase locking method is used to acquire and maintain the phase locked state in a phase locked loop. The phase locking method includes the following steps: filtering the locking signal component 47 and spurious signal components 49 of the feedback signal within the feedback path 42 of the phase locked loop 43; applying the drive signal 53; summing the drive signal 53 with the filtered locking signal component and filtered spurious signal components of the filtered feedback signal 51; limiting the summed drive signal and filtered locking signal component of the filtered feedback signal 51 and spurious signal components 49 of the feedback signal 45 to produce the limited signal 55; and phase comparing the limited signal 55 to the reference signal 13 to produce the error signal 57 for steering the frequency of the locking signal component 47.

While the preferred embodiments of the present invention has been illustrated in detail, it should be apparent that modifications and adaptations to these embodiments may occur to one skilled in the art without departing from the scope of the present invention as set forth in the following claims.

What is claimed is:

1. A phase locking apparatus for use within the feedback path of a phase locked loop, comprising:

a filter for limiting the bandwidth of a locking signal component and spurious signal components of a feedback signal within the feedback path;

a drive signal source providing a drive signal having a predetermined frequency offset from a reference signal and having an amplitude greater than the amplitude of the spurious signal components and less than the locking signal component;

a summer combining the drive signal with the filtered locking signal component and spurious signal components of the feedback signal;

a limiter receiving the combined drive signal and filtered feedback signal, limiting the summed drive signal and filtered locking signal component and filtered spurious signal components of the feedback signal to produce a limited signal having a phase determined by the drive signal when the amplitude of the drive signal exceeds the amplitude of the filtered locking signal component and determined by the filtered locking component when the amplitude of the filtered locking signal component exceeds the amplitude of the drive signal; and a phase comparator phase comparing the limited signal to the reference signal to produce an error signal for steering the frequency of the locking signal component.

2. The phase locking apparatus of claim 1 further comprising a drive switch for removing the drive signal when the error signal is within a predetermined range.

3. The phase locking apparatus of claim 1 wherein the filter comprises a lowpass filter.

4. The phase locking apparatus of claim 1 wherein the filter comprises a bandpass filter.

5. The phase locking apparatus of claim 1 wherein the amplitude of the drive signal is adjusted according to the amplitude of the locking signal component.

6. The phase locking apparatus of claim 5 wherein the amplitude of the drive signal has a predefined amplitude offset from the locking signal component.

7. A phase locking method, comprising the steps of:

filtering a locking signal component and spurious signal components of a feedback signal within the feedback path of a phase locked loop;

generating a drive signal having a predetermined frequency offset from a reference signal and having an amplitude greater than the amplitude of the spurious signal components and less than the locking signal component;

summing the drive signal with the filtered locking signal component and spurious signal components of the feedback signal;

limiting the summed drive signal and filtered locking signal component and filtered spurious signal components of the feedback signal to produce a limited signal having a phase determined by the drive signal when the amplitude of the drive signal exceeds the amplitude of the filtered locking signal component and determined by the filtered locking signal component when the amplitude of the filtered locking signal component exceeds the amplitude of the drive signal; and phase comparing the limited signal to the reference signal to produce an error signal for steering the frequency of the locking signal component.

8. The phase locking method of claim 7 further comprising the step of removing the drive signal when the error signal is within a predetermined range.

9. The phase locking method of claim 7 wherein the step of filtering comprises lowpass filtering.

10. The phase locking method of claim 7 wherein the step of filtering comprises bandpass filtering.

11. The phase locking method of claim 7 further comprising the steps of opening a forward path of the phase locked loop and pretuning the frequency of the locking signal component.

12. The phase locking method of claim 11 further comprising the step of closing the forward path of the phase locked loop.

13. The phase locking method of claim 12 wherein further comprising the step of removing the drive signal when the error signal is within a predetermined range.

14. The phase locking method of claim 7 wherein the step of generating a drive signal includes adjusting the amplitude of the drive signal according to the amplitude of the locking signal component.

15. The phase locking method of claim 14 wherein the amplitude of the drive signal has a predefined amplitude offset from the locking signal component.

* * * * *